United States Patent
Yang

(10) Patent No.: US 11,462,448 B2
(45) Date of Patent: Oct. 4, 2022

(54) STEP-TYPE STACKED CHIP PACKAGING STRUCTURE BASED ON RESIN SPACER AND PREPARATION PROCESS

(71) Applicant: SU ZHOU DREAM TECHNOLOGY CO., LTD., Suzhou (CN)

(72) Inventor: Guohong Yang, Suzhou (CN)

(73) Assignee: SU ZHOU DREAM TECHNOLOGY CO., LTD., Suzhou (CN)

( * ) Notice: Subject to any disclaimer, the term of this patent is extended or adjusted under 35 U.S.C. 154(b) by 90 days.

(21) Appl. No.: 17/043,735

(22) PCT Filed: Oct. 22, 2018

(86) PCT No.: PCT/CN2018/111152
§ 371 (c)(1),
(2) Date: Sep. 30, 2020

(87) PCT Pub. No.: WO2020/034386
PCT Pub. Date: Feb. 20, 2020

(65) Prior Publication Data
US 2021/0035873 A1    Feb. 4, 2021

(30) Foreign Application Priority Data

Aug. 14, 2018  (CN) .......................... 201810924734.7

(51) Int. Cl.
*H01L 23/14*        (2006.01)
*H01L 21/48*        (2006.01)
(Continued)

(52) U.S. Cl.
CPC ........ *H01L 23/145* (2013.01); *H01L 21/4853* (2013.01); *H01L 21/4857* (2013.01);
(Continued)

(58) Field of Classification Search
CPC ............................................. H01L 2225/06562
See application file for complete search history.

(56) References Cited

U.S. PATENT DOCUMENTS

| 6,437,449 B1* | 8/2002 | Foster ..................... H01L 24/49 257/676 |
| 2009/0166887 A1* | 7/2009 | Upadhyayula .......... H01L 24/06 257/E23.024 |

(Continued)

FOREIGN PATENT DOCUMENTS

| CN | 101399256 A | 4/2009 |
| CN | 101558490 A | 10/2009 |

(Continued)

*Primary Examiner* — Yu-Hsi D Sun
(74) *Attorney, Agent, or Firm* — Bayramoglu Law Offices LLC

(57) ABSTRACT

A step-type stacked chip packaging structure based on a resin spacer that includes: a plastic packaging material, a circuit board, a resin spacer, a first chip, a second chip and an electrical connection assembly. The resin spacer, the first chip, and the second chip are stacked on the circuit board respectively. The second chip is stacked on the first chip in a stepped manner. The circuit board, the first chip and the second chip are electrically connected together through the electrical connection assembly. The resin spacer uses a fiber glass fabric as its base material, a weight percent of the fiber glass fabric is 10-60 wt %, and the following components are attached to the fiber glass fabric as a percentage by the total weight of the resin spacer: 8-40 wt % of epoxy resin, 10-30 wt % of quartz powder, 2-10 wt % of aluminum oxide, 1-8 wt % of calcium oxide, and 1-8 wt % of curing agent.

16 Claims, 1 Drawing Sheet

(51) Int. Cl.
*H01L 23/29* (2006.01)
*H01L 23/498* (2006.01)
*H01L 23/538* (2006.01)
*H01L 23/00* (2006.01)
*H01L 25/065* (2006.01)

(52) U.S. Cl.
CPC ...... *H01L 23/293* (2013.01); *H01L 23/49822* (2013.01); *H01L 23/5383* (2013.01); *H01L 24/05* (2013.01); *H01L 24/29* (2013.01); *H01L 24/45* (2013.01); *H01L 24/83* (2013.01); *H01L 24/85* (2013.01); *H01L 25/0657* (2013.01); *H01L 2224/73265* (2013.01)

(56) References Cited

U.S. PATENT DOCUMENTS

| | | | |
|---|---|---|---|
| 2015/0228621 A1 | 8/2015 | Kumar et al. | |
| 2015/0311186 A1* | 10/2015 | Ye | H01L 24/73 438/109 |
| 2016/0276312 A1* | 9/2016 | Shimizu | H01L 24/92 |
| 2019/0051634 A1* | 2/2019 | Park | H01L 25/0657 |

FOREIGN PATENT DOCUMENTS

| | | |
|---|---|---|
| CN | 102800660 A | 11/2012 |
| CN | 206864462 U | 1/2018 |

\* cited by examiner

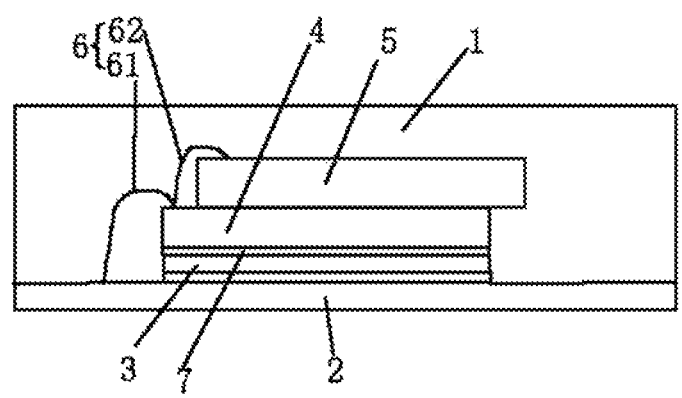

STEP-TYPE STACKED CHIP PACKAGING STRUCTURE BASED ON RESIN SPACER AND PREPARATION PROCESS

CROSS REFERENCE TO THE RELATED APPLICATIONS

This application is the national phase entry of International Application No. PCT/CN2018/111152, filed on Oct. 22, 2018, which is based upon and claims priority to Chinese Patent Application No. 201810924734.7, filed on Aug. 14, 2018, the entire contents of which are incorporated herein by reference.

TECHNICAL FIELD

The present invention relates to the technical field of chip packaging, specifically a step-type stacked chip packaging structure based on a resin spacer and a preparation process thereof.

BACKGROUND

With the development of the modern integrated circuit, the chip packaging technology in the microelectronics industry has rapidly expanded from a two-dimensional stacked packaging to a three-dimensional stacked packaging form to meet market requirements of lighter, thinner, smaller, high-performance, low-power-consumption, and low-cost chip packaging structures. The three-dimensional stacked packaging technology not only improves the packaging density, reduces the cost, and accelerates the packaging speed, but also greatly enhances the multi-functional integration without increasing the packaging size.

Currently, the spacers that are being used in the three-dimensional stacked chip packaging structure are typically silicon-based wafer spacers. However, the silicon-based wafer spacer has the following disadvantages: the preparation process, such as filming, thinning, cutting, consumes large amount of machine capacities, and it is limited by the sizes (a maximum size is 12 inches) of the silicon-based wafer spacers, which causes low yield, long preparation process time, and large consumptions of auxiliary materials (adhesive film, grinding wheels, cutting tools). Additionally, the silicon-based wafer spacers are very easy to crack during both the processing procedure and use, thereby causing the yield of products to be even lower while increasing the production cost. In particular, the spacer is limited to certain thickness threshold as it becomes more fragile as it becomes thinner. Therefore, the packaging size cannot be reduced beyond certain limit by simply thinning the silicon-based wafer spacer, which in terms limits the thickness of the stacked chip.

SUMMARY

The technical problems to be resolved by the present invention are associated with the packaging size of the existing chip stacked packaging structure being too large, and the silicon-based wafer spacers for the existing chip packaging are being too fragile, which all contribute to high production costs, limits in reducing the thickness of a spacer, lengthy preparation process, and added consumption of auxiliary materials. In order to solve the above technical problems, a step-type stacked chip packaging structure based on a resin spacer and a preparation process thereof is provided.

The technical solution adopted by the present invention for solving the technical problem is as follows.

A step-type stacked chip packaging structure based on a resin spacer that includes a plastic packaging material, a circuit board, a resin spacer, a first chip, a second chip and an electrical connection assembly.

The resin spacer, the first chip and the second chip are stacked on the circuit board in sequence, and the second chip is stacked on the first chip in a stepped manner.

The electrical connection assembly includes a first bonding wire that is connected in series with a second bonding wire. A plurality of bonding pads are provided on upper surface edges of the circuit board, the first chip and the second chip at the same side. The bonding pad of the first chip and the bonding pad of the circuit board are electrically connected by the first bonding wire, and the bonding pad of the second chip and the bonding pad of the first chip are electrically connected by the second bonding wire.

The circuit board, the resin spacer, the first chip, and the second chip are adhered together by an adhesive layer.

The resin spacer, the first chip, the second chip, the electrical connection assembly, and the adhesive layer are sealed on the circuit board by the plastic packaging material.

The base material for the resin spacer is a fiber glass fabric with a weight percent of 10-60 wt %, and the following components are attached to the fiber glass fabric as a percentage by the total weight of the resin spacer: 8-40 wt % of epoxy resin, 10-30 wt % of quartz powder, 2-10 wt % of aluminum oxide, 1-8 wt % of calcium oxide, and 1-8 wt % of curing agent.

Preferably, the base material for the resin spacer is fiber glass fabric with a weight percent of 40-60 wt %, and the following components are attached to the fiber glass fabric as a percentage by the total weight of the resin spacer: 30-40 wt % of epoxy resin, 10-20 wt % of quartz powder, 5-10 wt % of aluminum oxide, 2-8 wt % of calcium oxide, and 4-8 wt % of curing agent.

Preferably, the resign spacer used for chip stacking and packaging further includes a pigment with a weight percent of 1-3 wt %, and the pigment is preferably at least one selected from white carbon black and pearl powder.

Preferably, the epoxy resin is at least one selected from a phosphating epoxy resin, a biphenyl epoxy resin, a bisphenol epoxy resin, a novolac epoxy resin, a glycerin epoxy resin, an O-methyl novolac epoxy resin, a naphthol epoxy resin, and a dicyclopentadiene epoxy resin.

Preferably, the curing agent is at least one selected from aliphatic amines, alicyclic amines, aromatic amines, polyamides, dicyandiamides, and imidazole compounds.

Preferably, the mesh size of the glass fiber fabric is 100-200 mesh, the mesh size of the quartz powder is 200-400 mesh, the mesh size of the aluminum oxide is 400-600 mesh, and the mesh size of the calcium oxide is 200-400 mesh.

Preferably, the thickness of the resin spacer is 0.07-0.13 mm.

Preferably, one or more layers of chips are stacked above the second chip in a stepped manner, the plurality of bonding pads on the adjacent chips are electrically connected through a plurality of bonding wires, and the adjacent bonding wires are connected in series.

The present invention further provides a preparation process of the step-type stacked chip packaging structure based on the resin spacer, which includes the following steps:

adhering the adhesive film to a back surface of the resin spacer, and then cutting the resin spacer to obtain the resin spacer adhered with the adhesive film of the required size;

providing a circuit board, a first chip and a second chip, stacking the resin spacer adhered with the adhesive film, the first chip, and the second chip on the circuit board, respectively, stacking the second chip on the first chip in a stepped manner, and adhering the circuit board, the resin spacer, the first chip, and the second chip together through the adhesive film;

electrically connecting a bonding pad of the first chip and a bonding pad of the circuit board by using the first bonding wire, and electrically connecting a bonding pad of the second chip and the bonding pad of the first chip by using the second bonding wire, connecting the first bonding wire and the second bonding wire in series; and sealing the resin spacer, the first chip, the second chip, the first bonding wire, and the second bonding wire on the circuit board by using the plastic packaging material.

Preferably, the resign spacer is prepared by the following method, which includes the following steps:

S1: mixing: adding 8-40 parts by weight of epoxy resin, 10-30 parts by weight of quartz powder, 2-10 parts by weight of aluminum oxide, and 1-8 parts by weight of calcium oxide into a solvent, stirring for dissolving them, adding 1-8 parts by weight of curing agent, and dispersing them uniformly obtain a resin gelatinous solution;

S2: impregnating: impregnating 10-60 parts by weight of the fiber glass fabric into the prepared resin gelatinous solution to obtain an impregnated fabric, and controlling an impregnating amount to be 50-70 g/m$^2$;

S3: partially curing: drying the impregnated fabric and controlling a pre-curing degree to 30-50% to obtain a prepreg;

S4: stacking and pressing: laminating a plurality of prepregs, then heating and pressing them simultaneously, stopping the heating after a period of heat preservation, and obtaining a resign spacer with a certain thickness after cooling.

Preferably, the drying temperature in step S3 is 70-120° C., the heating temperature in step S4 is 150-180° C., the heat preservation time is 8-12 h, and the pressing pressure is 3-10 MPa.

Preferably, the solvent is at least one selected from acetone, butanone, ethyl acetate, butyl acetate, ethanol, ethylene glycol monomethyl ether, ethylene glycol dimethyl ether, N,N-dimethylformamide, N,N-dimethylacetamide, and N-methylpyrrolidone.

The advantages of the present invention are as follows.

(1) The present invention provides the step-type stacked chip packaging structure based on the resin spacer and a preparation process. The resign spacer composed of a specific material is used to replace the conventional silicon-based spacer, the thickness of the resin spacer is reduced, which implements the feasibility of stacking more layers of chips on the substrate, decreases the packaging size, ensures the balance of structure after completing the entire packaging, and effectively avoids risks of chip warpage and internal cracks. In addition, the preparation process of the resin spacer for chip packaging does not require certain procedures, such as filming, thinning or the like, which further reduces packaging costs and shortens preparation cycles.

(2) The resin spacer used for chip stacking and packaging in the present invention has good flexibility, and it is less fragile, anti-aging, and easy to be stored. The resin spacer can be pre-processed without any limitations to its size and thickness, additionally, the resin spacer has excellent electrical insulation such that the breakdown voltage for the resin spacer is far greater than that of the silicon-based spacer. The resin spacer in the present invention is well hydrophilic, which enables it to be adhered to the chip using just ordinary glue. The ether group, benzene ring, and aliphatic hydroxyl in the curing system are not easily corroded by acid and alkali, but the resin spacer of present invention can replace the silicon-based spacer widely used in chip stacking and packaging at present.

BRIEF DESCRIPTION OF THE DRAWING

The present invention will be further described hereinafter in conjunction with the drawing and embodiments.

FIG. 1 is a section view of a step-type stacked chip packaging structure based on a resin spacer;

The reference designators in FIG. 1 are: 1: plastic packaging material, 2: circuit board, 3: resin spacer, 4: first chip, 5: second chip, 6: electrical connection assembly, 61: first bonding wire, 62: second bonding wire, and 7: adhesive layer.

DETAILED DESCRIPTION OF THE EMBODIMENTS

Hereinafter, the present invention is further described in detail in conjunction with the FIGURE. The FIGURE is a simplified schematic diagram, which merely illustrates a basic structure of the present invention in a schematic manner, and it only shows the constitutions related to the present invention.

Embodiment 1

The present embodiment provides a step-type stacked chip packaging structure based on a resin spacer, as shown in FIG. 1. The step-type stacked chip packaging structure includes: plastic packaging material 1, circuit board 2, resign spacer 3, first chip 4, second chip 5, and electrical connection assembly 6.

The resin spacer 3, the first chip 4, and the second chip 5 are stacked on the circuit board 2 in respectively, the second chip 5 is stacked on the first chip 4 in a stepped manner, which does not obstruct the bonding of a bonding pad of the first chip 4. The resin spacer 3 protects an ultra-thin chip from cracking caused by unevenness of the circuit board 2.

The electrical connection assembly 6 includes a first bonding wire 61 that is connected in series with a second bonding wire 62. Upper surface edges of the circuit board 2, the first chip 4 and the second chip 5 are provided with a plurality of bonding pads at the same side. For example, the plurality of bonding pads are arranged on upper surfaces of the circuit board 2, the first chip 4, and the second chip 5 at the same side, respectively, to form at least one row. A bonding pad of the first chip 4 and a bonding pad of the circuit board 2 are electrically connected by the first bonding wire 61, and a bonding pad of the second chip 5 and the bonding pad of the first chip 4 are electrically connected by the second bonding wire 62.

The stacked chip packaging structure further includes a plurality of adhesive layers 7 that are respectively located between the circuit board 2 and the resin spacer 3, between the first chip 4 and the resin spacer 3, and between the first chip 4 and the second chip 5, such that the circuit board 2, the resin spacer 3, the first chip 4 and the second chip 5 are adhered together. The plurality of adhesive layers 7 in the present embodiment are adhesive and insulating films. The adhesive layers 7 are pre-attached to the back surfaces of the resin spacer 3, the first chip 4, and the second chip 5, respectively, before stacking and assembling; each of the adhesive layers 7 and the back surfaces of the corresponding components approximately have the same length and width. A thickness of the adhesive layer 7 is preferably 10-25 μm.

The resin spacer 3, the first chip 4, the second chip 5, the electrical connection assembly 6, and the adhesive layer 7 are sealed on the circuit board 2 by the plastic packaging material 1.

The resin spacer 3 uses a fiber glass fabric as a base material, the weight percent of the fiber glass fabric is 10-60 wt %, and the following components are attached to the fiber glass fabric as a percentage by the total weight of the resin spacer 3: 8-40 wt % of epoxy resin, 10-30 wt % of quartz powder, 2-10 wt % of aluminum oxide, 1-8 wt % of calcium oxide, and 1-8 wt % of curing agent.

Preferably, the resin spacer 3 uses the fiber glass fabric as the base material, the weight percent of the fiber glass fabric is 40-60 wt %, and the following components are attached to the fiber glass fabric as a percentage by the total weight of the resin spacer 3: 30-40 wt % of epoxy resin, 10-20 wt % of quartz powder, 5-10 wt % of aluminum oxide, 2-8 wt % of calcium oxide, and 4-8 wt % of curing agent.

Preferably, the resign spacer used for chip stacking and packaging further includes a pigment, the weight percent of the pigment is 1-3 wt %, and the pigment is preferably at least one of white carbon black and pearl powder.

Preferably, the epoxy resin is at least one selected from a phosphating epoxy resin, a biphenyl epoxy resin, a bisphenol epoxy resin, a novolac epoxy resin, a glycerin epoxy resin, an O-methyl novolac epoxy resin, a naphthol epoxy resin, and a dicyclopentadiene epoxy resin.

Preferably, the mesh size of the glass fiber fabric is 100-200 mesh (e.g., 100 mesh, 150 mesh, 200 mesh), the mesh size of the quartz powder is 200-400 mesh (e.g., 200 mesh, 300 mesh, 400 mesh), the mesh size of the aluminum oxide is 400-600 mesh (e.g., 400 mesh, 500 mesh, 600 mesh), and the mesh size of the calcium oxide is 200-400 mesh (e.g., 200 mesh, 300 mesh, 400 mesh).

Preferably, the curing agent is at least one selected from aliphatic amines, alicyclic amines, aromatic amines, polyamides, dicyandiamides, and imidazole compounds.

Preferably, the resin spacer has a thickness of 0.07-0.13 mm (e.g., 0.07 mm, 0.1 mm, 0.13 mm).

Preferably, one or more layers of chips are stacked above the second chip 5 in a stepped manner, bonding pads on adjacent chips are electrically connected through bonding wires, and the adjacent bonding wires are connected in series.

Embodiment 2

The present embodiment further provides a preparation process of the step-type stacked chip packaging structure based on the resin spacer, which includes the following steps:
  adhering the adhesive film to the back surface of the resin spacer, and then cutting the resin spacer to obtain the resin spacer adhered with the adhesive film of the required size;
  providing a circuit board, a first chip, and a second chip, stacking the resin spacer, the first chip, and the second chip on the circuit board, respectively, stacking the second chip on the first chip in a stepped manner, and adhering the circuit board, the resin spacer, the first chip, and the second chip together through the adhesive film;
  electrically connecting a bonding pad of the first chip and a bonding pad of the circuit board by using the first bonding wire, and electrically connecting a bonding pad of the second chip and the bonding pad of the first chip by using the second bonding wire, connecting the first bonding wire and the second bonding wire in series; and
  sealing the resin spacer, the first chip, the second chip, the first bonding wire, and the second bonding wire on the circuit board by using the plastic packaging material.

At present, the preparation method of the silicon-based spacer applied for the stacked chip packaging structure is: providing a wafer, and adhering a protection film to a front surface of the wafer; backgrinding the back surface of the wafer by using a polisher to a required thickness, where the back surface is not adhered with the protection film; adhering an adhesive tape to the back surface of the wafer, and fixing the wafer to a substrate; tearing off the protection film on the back surface, and cutting it to a required size by using a cutter; and curing the adhesive tap by ultraviolet (UV) radiation. Accordingly, compared with the silicon-based spacer, the preparation of the resin spacer with a small size applied to the stacked chip packaging structure no longer require the use of a film laminator, a thinning grinder, and other apparatuses forming, and reduces the production cost, shortens the manufacturing cycle, and enhances the reliability of the stacking and packaging.

The preparation method of the resin spacer includes the following steps:
  S1: mixing: adding 8-40 parts by weight of epoxy resin, 10-30 parts by weight of quartz powder, 2-10 parts by weight of aluminum oxide, and 1-8 parts by weight of calcium oxide into a solvent, stirring for dissolving them, adding 1-8 parts by weight of curing agent, and dispersing them uniformly to obtain a resin gelatinous solution;
  S2: impregnating: impregnating 10-60 parts by weight of the fiber glass fabric into the prepared resin gelatinous solution to obtain an impregnated fabric, and controlling an impregnating amount to be 50-70 g/m$^2$ (e.g., 50 g/m$^2$, 60 g/m$^2$, 70 g/m$^2$);
  S3: partially curing: drying the impregnated fabric at 70-120° C. (e.g., 70° C., 100° C., 120° C.), and controlling a pre-curing degree at 30-50% (e.g., 30%, 40%, 50%) to obtain a prepreg;
  S4: stacking and pressing: laminating a plurality of prepregs, then heating them at a temperature of 150-180° C. (e.g., 150° C., 160° C., 180° C.), pressing them at a pressure of 3-10 MPa simultaneously, stopping the heating after 8-12 h (e.g., 8 h, 10 h, 12 h) of heat preservation, and obtaining a resign spacer with a certain thickness after cooling.

Preferably, the solvent is at least one selected from acetone, butanone, ethyl acetate, butyl acetate, ethanol, ethylene glycol monomethyl ether, ethylene glycol dimethyl ether, N,N-dimethylformamide, N,N-dimethylacetamide, and N-methylpyrrolidone.

Based on the above ideal embodiments and descriptions of the present invention, the person skilled in the prior art can make various changes and modifications without departing from the scope of the technical concept of the present invention. The technical scope of the present invention is not limited to the contents of the description, and the technical scope must be determined according to the scope of the claims.

The invention claimed is:

1. A step-type stacked chip packaging structure based on a resin spacer comprising: a plastic packaging material, a circuit board, a resign spacer, a first chip, a second chip, and an electrical connection assembly, wherein
the resin spacer, the first chip and the second chip are stacked on the circuit board in sequence, wherein the second chip is stacked on the first chip in a stepped manner;
the electrical connection assembly comprises a first bonding wire connected to a second bonding wire in series, wherein a plurality of bonding pads are provided on upper surface edges of the circuit board, the first chip and the second chip at the same side, a bonding pad of the first chip and a bonding pad of the circuit board are electrically connected by the first bonding wire, and a bonding pad of the second chip and the bonding pad of the first chip are electrically connected by the second bonding wire;
the circuit board, the resin spacer, the first chip, and the second chip are adhered together by an adhesive layer;
the resin spacer, the first chip, the second chip, the electrical connection assembly, and the adhesive layer are sealed on the circuit board by the plastic packaging material; and
the resin spacer has a base material of a fiber glass fabric, a weight percent of the fiber glass fabric is 10-60 wt %, and the resin spacer further comprises: 8-40 wt % of epoxy resin, 10-30 wt % of quartz powder, 2-10 wt % of aluminum oxide, 1-8 wt % of calcium oxide, and 1-8 wt % of curing agent.

2. The step-type stacked chip packaging structure according to claim 1, wherein the resin spacer has the base material of the fiber glass fabric, the weight percent of the fiber glass fabric is 40-60 wt %, and the resin spacer further comprises: 30-40 wt % of the epoxy resin, 10-20 wt % of the quartz powder, 5-10 wt % of the aluminum oxide, 2-8 wt % of the calcium oxide, and 4-8 wt % of the curing agent.

3. The step-type stacked chip packaging structure according to claim 2, wherein
the epoxy resin is at least one selected from the group of a phosphating epoxy resin, a biphenyl epoxy resin, a bisphenol epoxy resin, a novolac epoxy resin, a glycerin epoxy resin, an O-methyl novolac epoxy resin, a naphthol epoxy resin, and a dicyclopentadiene epoxy resin, and
the curing agent is at least one selected from the group of aliphatic amines, alicyclic amines, aromatic amines, polyamides, dicyandiamides, and imidazole compounds.

4. The step-type stacked chip packaging structure according to claim 2, wherein the resin spacer has a thickness of 0.07-0.13 mm, wherein the glass fiber fabric has a mesh size of 100-200 mesh, wherein the quartz powder has a mesh size of 200-400 mesh, the aluminum oxide has a mesh size of 400-600 mesh, and the calcium oxide has a mesh size of 200-400 mesh.

5. The step-type stacked chip packaging structure according to claim 2, wherein the resin spacer further comprises a pigment, with a weight percent of 1-3 wt %, wherein the pigment is at least one selected from the group of white carbon black and pearl powder.

6. The step-type stacked chip packaging structure according to claim 2, wherein at least one chips are stacked on the second chip in the stepped type, the plurality of bonding pads on adjacent chips are electrically connected through bonding wires, and adjacent bonding wires are connected in series.

7. The step-type stacked chip packaging structure according to claim 1, wherein
the epoxy resin is at least one selected from the group of a phosphating epoxy resin, a biphenyl epoxy resin, a bisphenol epoxy resin, a novolac epoxy resin, a glycerin epoxy resin, an O-methyl novolac epoxy resin, a naphthol epoxy resin, and a dicyclopentadiene epoxy resin, and
the curing agent is at least one selected from the group of aliphatic amines, alicyclic amines, aromatic amines, polyamides, dicyandiamides, and imidazole compounds.

8. The step-type stacked chip packaging structure according to claim 7, wherein the resin spacer has a thickness of 0.07-0.13 mm, wherein the glass fiber fabric has a mesh size of 100-200 mesh, wherein the quartz powder has a mesh size of 200-400 mesh, the aluminum oxide has a mesh size of 400-600 mesh, and the calcium oxide has a mesh size of 200-400 mesh.

9. The step-type stacked chip packaging structure according to claim 7, wherein the resin spacer further comprises a pigment, with a weight percent of 1-3 wt %, wherein the pigment is at least one selected from the group of white carbon black and pearl powder.

10. The step-type stacked chip packaging structure according to claim 7, wherein at least one chips are stacked on the second chip in the stepped type, the plurality of bonding pads on adjacent chips are electrically connected through bonding wires, and adjacent bonding wires are connected in series.

11. The step-type stacked chip packaging structure according to claim 1, wherein the resin spacer has a thickness of 0.07-0.13 mm, wherein the glass fiber fabric has a mesh size of 100-200 mesh, wherein the quartz powder has a mesh size of 200-400 mesh, the aluminum oxide has a mesh size of 400-600 mesh, and the calcium oxide has a mesh size of 200-400 mesh.

12. The step-type stacked chip packaging structure according to claim 11, wherein the resin spacer further comprises a pigment, with a weight percent of 1-3 wt %, wherein the pigment is at least one selected from the group of white carbon black and pearl powder.

13. The step-type stacked chip packaging structure according to claim 11, wherein at least one chips are stacked on the second chip in the stepped type, the plurality of bonding pads on adjacent chips are electrically connected through bonding wires, and adjacent bonding wires are connected in series.

14. The step-type stacked chip packaging structure according to claim 1, wherein the resin spacer further comprises a pigment, with a weight percent of 1-3 wt %, wherein the pigment is at least one selected from the group of white carbon black and pearl powder.

15. The step-type stacked chip packaging structure according to claim 14, wherein at least one chips are stacked on the second chip in the stepped type, the plurality of bonding pads on adjacent chips are electrically connected through bonding wires, and adjacent bonding wires are connected in series.

16. The step-type stacked chip packaging structure according to claim 1, wherein at least one chips are stacked on the second chip in the stepped manner, the plurality of bonding pads on adjacent chips are electrically connected through bonding wires, and adjacent bonding wires are connected in series.

\* \* \* \* \*